United States Patent [19]

Miyakawa et al.

[11] 4,023,159
[45] May 10, 1977

[54] NON-LINEAR ANALOGUE-DIGITAL CONVERTER

[75] Inventors: Nobuaki Miyakawa, Hitachi; Masayuki Miki, Katsuta, both of Japan

[73] Assignee: Hitachi, Ltd., Japan

[22] Filed: Jan. 28, 1975

[21] Appl. No.: 544,758

[30] Foreign Application Priority Data

Feb. 1, 1974 Japan .................... 49-12783

[52] U.S. Cl. .................. 340/347 AD; 235/197; 340/347 M
[51] Int. Cl.² .................. H03K 13/02
[58] Field of Search ........... 340/347 AD, 347 CC; 235/197, 150.53

[56] References Cited

UNITED STATES PATENTS

| | | | |
|---|---|---|---|
| 3,475,740 | 10/1969 | Ehrlich et al. | 340/174.1 |
| 3,568,181 | 3/1971 | Weaver | 340/347 |
| 3,710,376 | 1/1973 | Fluegel | 340/347 CC |
| 3,733,474 | 5/1973 | Edwards et al. | 235/151.35 |

*Primary Examiner*—Thomas J. Sloyan
*Attorney, Agent, or Firm*—Craig & Antonelli

[57] ABSTRACT

A non-linear analogue-to-digital converter having analogue-to-digital conversion relation curves on the basis of which the conversion is carried out and which curves can be freely exchanged. The converter comprises a gate pulse generator circuit for producing gate pulses of a predetermined duration, an oscillator for producing a signal of a variable frequency in response to a signal representing an input analogue quantity in which an element for varying analogue-frequency relation is incorporated, a counter for counting the signal from the oscillator during the duration of the gate pulse signal, and an arrangement for controlling the converter in accordance with pre-determined patterns in dependence on the count value of the counter.

6 Claims, 4 Drawing Figures

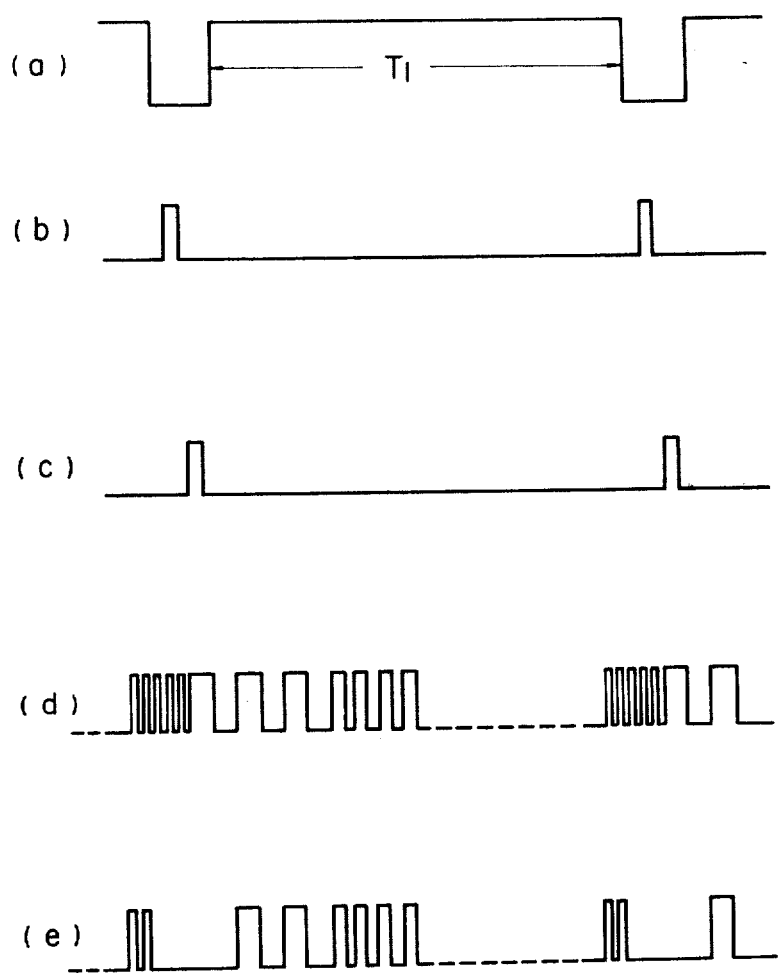

NON-LINEAR ANALOGUE-DIGITAL CONVERTER

The present invention relates to a non-linear analogue-to-digital or A-D converter and more particularly to a non-linear A-D convertor in which the converting relations between the analogue input and the digital output can be easily changed. More specifically, the invention concerns with a non-linear A-D convertor of the above type having a function generator in which a charging and discharging of a capacitor constituting an integrator is utilized.

In the past, the non-linear A-D converter has been employed for varying resolving-power in dependence on analogue inputs.

In the non-linear converter for converting an analogue quantity into a non-linear digital quantity, it is known that the analogue quantity is once converted into a linear digital quantity which is then converted into the non-linear digital quantity by means of a digital-to-digital or D-D converter. In such conventional type of A-D converter, an additional D-D converter is required besides the A-D converter. Further, in order to freely exchange the converting relationships between the analogue and the digital quantities, another corresponding function unit has to be additionally provided. This results in a complicated and expensive construction of the non-linear A-D converter. In an attempt to eliminate such disadvantages, it has been proposed to convert the analogue quantity directly into the non-linear digital quantity. For example, a non-linear A-D converter is known which has a non-linear function generator utilizing a voltage-to-frequency converter and logic circuits. In case of another hitherto known non-linear converter, a non-linear function generator is employed which comprises logic circuits and an integrator having resistance and capacitance elements subjected to variation in their values through analogue switches. However, these prior known converters are disadvantageous in that the time required for the conversion is increased, as the digital output increases.

It is also known to combine an A-D converter with an oscillator having a plurality of oscillation frequencies thereby to vary the frequency in dependence on the analogue quantity. This system requires, however, a plurality of oscillators which involves also a complicated and expensive structure of the converter. Further, this system has the disadvantage of an increasing length of time for the conversion in case of an increased digital output.

An object of the invention is to provide a non-linear analogue-to-digital or A-D converter which is suited for use in the detector apparatus for detecting an aperture of a throttle valve in a motor vehicle, for example.

Another object of the present invention is to provide a non-linear A-D converter which allows an arbitrary variation in the converting relation between the analogue and the digital quantities.

Still another object of the invention is to provide a non-linear A-D converter having a short conversion time which is not adversely influenced by the increased digital output.

Further object of the present invention is to provide a non-linear A-D converter which exhibits a variable analogue-to-digital conversion characteristic of a high accuracy in the approximation due to the possibility of arbitrary combinations of non-linear converting relations between the analogue and the digital quantities.

According to the present invention, there is provided a non-linear analogue-to-digital converter having a variable conversion performance, comprising a gate pulse generator circuit for producing gate pulses of a predetermined constant duration, an oscillation means for producing a signal of variable frequency in response to a signal representing an analogue quantity, said oscillation means including an element to vary an analogue-to-frequency conversion characteristic thereof, a counter means for counting signals produced by said oscillation means during the duration of said gate pulse, and means for controlling said element for varying said analogue-to-frequency characteristic of said oscillation means in accordance with predetermined patterns.

In the following, the invention will be described by referring to preferred embodiments shown in the accompanying drawings, in which:

FIG. 3 shows wave forms of several signals produced by certain circuit elements employed in the apparatus shown in FIG. 1 to illustrate the operations thereof.

Figure 1:
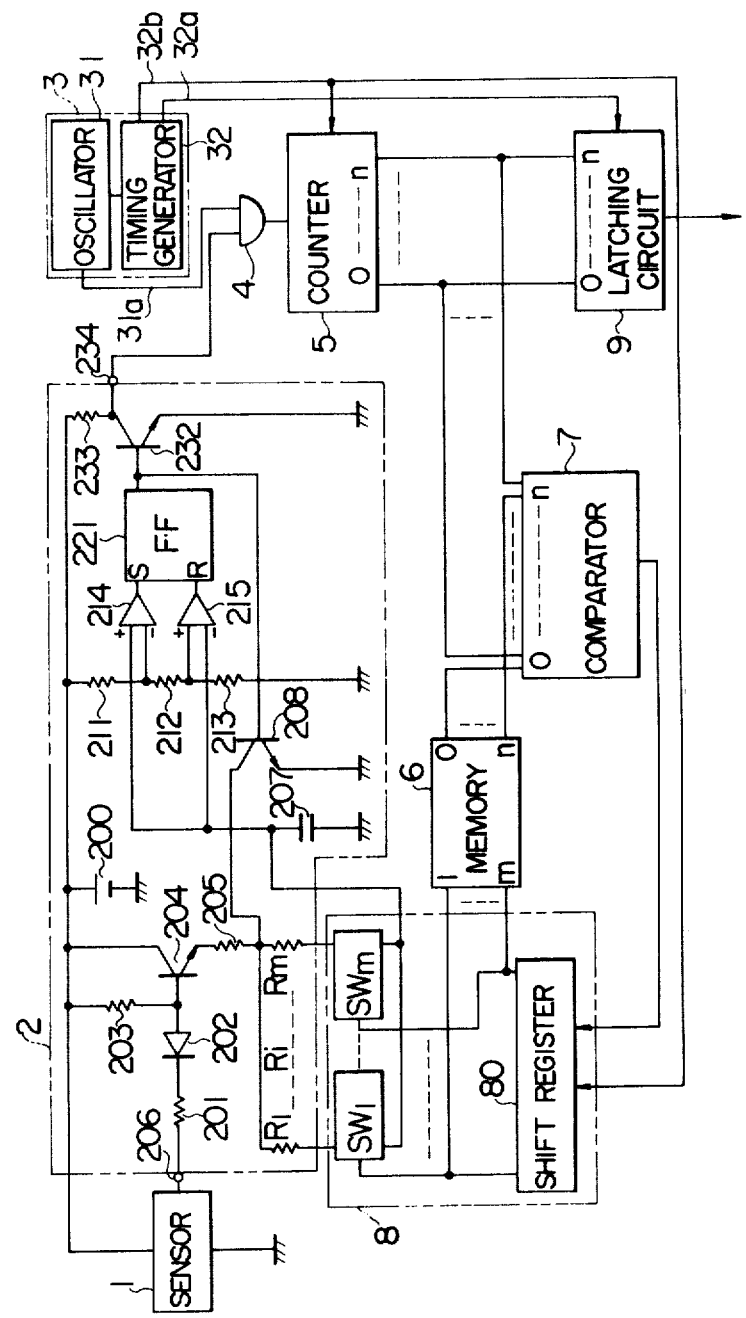
FIG. 1 is a circuit diagram showing an exemplary embodiment of the present invention.

Referring to FIG. 1, the non-linear enalogue-digital converter embodying the present invention comprises in general a sensor 1 for detecting an analogue quantity of a displacement, a function generator 2 having a plurality of different analogue-digital conversion relations, a control pulse generation circuit 3, an AND gate 4, a counter circuit 5, a memory circuit 6, a comparator circuit 7, a switching circuit 8 and a latching circuit 9.

In more detail, the sensor 1 may be composed of a potentiometer or the like which produces a linear output in response to a change or variation in the aperture of a throttle valve, for example. The output signal from the sensor 1 is supplied to an input terminal 206 of the function generator 2.

The function generator 2 comprises a source of current 200 and a transistor 204 which is biased through resistors 201 and 203. A diode 202 connected between the resistor 201 and the base of the transistor 204 serves for the compensation of variation in temperature. The transistor 204 has a collector connected to the source of current 200 and an emitter connected through a resistor 205 to a resistor $R_i$ which is constituted by one of m resistors $R_1$ to $R_m$. The resistors 205 and $R_i$ are connected in series to a capacitor 207 to form an integrator circuit. The resistor $R_i$ will be described in detail hereinafter.

The integration output from the integrator circuit, that is, the voltage at the capacitor 207 is coupled to a positive input terminal of a comparator 214 and a negative input terminal of a comparator 215. On the other hand, the negative input terminal of the comparator 214 is connected to a resistor 212 which forms a voltage division circuit for the source voltage together with resistors 211 and 213, while the positive input terminal of the comparator 215 is connected to a resistor 213 constituting another voltage dividing circuit for the source voltage in cooperation with the resistors 211 and 212. These comparators 214 and 215 have output terminals connected to a set and a reset input terminals of a flip-flop circuit 221, respectively, the set output terminal of which in turn is connected to the base of a transistor 232 having an emitter grounded to earth and a collector connected to the source of current 200 through a resistor 233. The transistor 232 constitutes a NOT gate.

The output terminal of the flip-flop circuit 221 is additionally connected to the base of a transistor 208 having a grounded emitter and a collector connected between the resistors 205 and $R_i$.

When the set output of the flip-flop 221 is logically "0", that is, when the flip-flop 221 is in the reset state, the transistor 208 is in the nonconductive state. The potential at the emitter of the transistor 204 varies linearly in dependence upon the output voltage from the sensor 1, and the voltage at the capacitor 207 will vary expotentially due to the potential at the emitter and a time constant determined by values of the resistors 205 and $R_i$ and the capacitor 207. If the emitter potential in this state is represented by $V_{E204}$ with the charging current of the capacitor 207 represented by $ic_{204}$, the resistances of the resistors 205 and $R_i$ by $R_{205}$ and $R_i'$, the capacitance of the capacitor 207 by $C_{207}$ and the amplification factor of the transistor 204 by $\beta$, relations among these factors can be expressed as follows:

$$V_{E204} = (R_{205} + R_i')ic_{204} + \frac{1}{C_{207}} \int ic_{204} dt$$

and $$ic_{204} = \beta \cdot ib_{204}$$

From these equations, it follows $$ic_{204} = \frac{V_{E204}}{R_{205} + R_i'} \epsilon - \frac{t}{C_{207}(R_{205} + R_i')}$$

If the voltage across the resistors 205 and $R_i$ is represented by $V_R$ with the voltage at the capacitor 207 represented by $V_c$, then $$V_{E204} = V_R + V_c$$

and $$V_R = ic_{204}(R_{205} + R_i')$$

From the above expressions, the voltage $V_c$ across the capacitor $C_{207}$ can be given by the following expression.

$$V_c = V_{E204}\left(1 - \epsilon - \frac{t}{C_{207}(R_{205} + R_i')}\right)$$

The comparators 214 and 215 are applied, respectively, with reference voltages Va and Vb which are determined by the resistors 211, 212 and 213. In this connection, it is to be noted that the comparator 214 produces an output signal when the voltage at the positive input terminal thereof is greater than the reference voltage Va, while the comparator 215 is adapted to produce an output signal when the voltage at the negative input terminal thereof becomes lower than the reference voltage Vb. It is assumed that the reference voltage Va is greater than Vb. Then, the time $t_1$ interval during which the capacitor 207 is charged from Vb to Va through the resistors 205 and $R_i$ thereby to set the flip-flop circuit 221 by the output from the comparator 214 can be expressed as follows:

$$t_1 = -C_{207}(R_{205} + R_i') \ln\left(\frac{V_{E204} - Va}{V_{E204} - Vb}\right)$$

On the other hand, the time interval $t_2$ during which the voltage at the capacitor 207 is decreased from Va to Vb through the discharge of the capacitor 207 by way of the resistor $R_i$ in the saturated state of the transistor 208 to thereby reset the flip-flop 221 through the output from the comparator 215 due to the lower potential at the negative input thereof than the reference voltage Vb can be given by the following expression.

$$t_2 = -C_{207} \cdot R_i' \ln \frac{Vb}{Va}$$

The operations mentioned above are repeated, whereby a pulse signal is produced at the set output terminal of the flip-flop circuit 221.

If the period of the pulse signal from the flip-flop 221 is represented by T, then $$T = t_1 + t_2 = -C_{207}\left\{(R_{205} + R_i') \ln\left(\frac{V_{E204} - Va}{V_{E204} - Vb}\right) + R_i' \ln \frac{Vb}{Va}\right\}$$

Accordingly, the frequency f of the pulse signal from the flip-flop 221 can be given by the following expression:

$$f = \frac{1}{T} = \frac{1}{-C_{207}\left\{(R_{205} + R_i') \ln\left(\frac{V_{E204} - Va}{V_{E204} - Vb}\right) + R_i' \ln \frac{Vb}{Va}\right\}}$$

The above expression shows that the pulse signal output from the function generator 2 varies non-linearly relative to the emitter voltage $V_{E204}$ of the transistor 204 which varies linearly in response to the analogue input thereto from the sensor 1. Further, it is apparent from the above equation that the frequency f can also be varied as a function of variation in the resistance value $R_i'$.

The pulse signal having the variable frequency f is generated at the output terminal 234 through the NOT gate which is constituted by the transistor 232 having an emitter grounded, a base connected to the flip-flop 221 and a collector connected to the current source 200 through the resistor 233 as hereinbefore described.

Figure 2A:
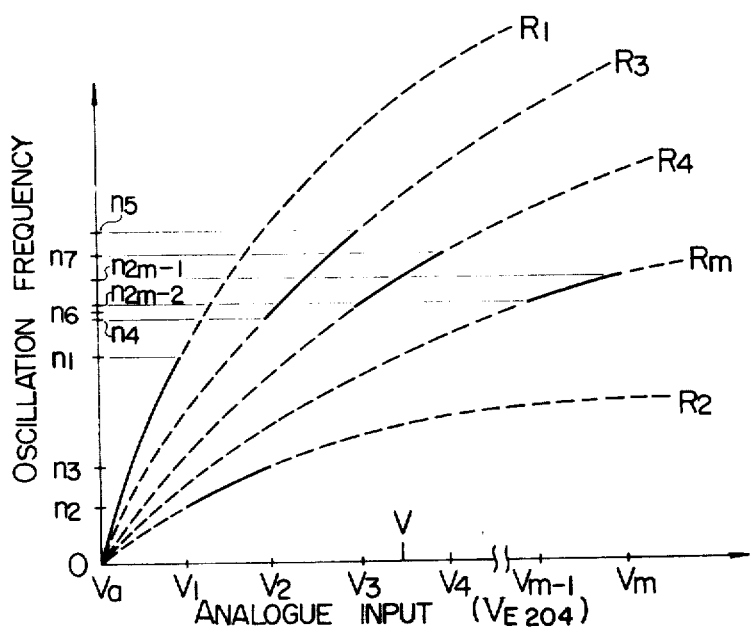
FIG. 2a is a graph illustrating relations between the analogue quantities and the produced frequencies of a function generator according to the invention.

From the foregoing description, it will be understood that the function generator 2 exhibits a non-linear behavior in the conversion of the analogue input quantity into the digital output and that the non-linear conversion is variable as a function of $R_i'$, as is shown in FIG. 2a in which relations between the analogue input and the oscillation frequency are graphically indicated with $R_i'$ taken as the parameter.

The control pulse generator circuit 3 comprises as oscillator 31 for producing pulses having a predetermined period and a timing generator 32 having an end connected to the oscillator 31. The oscillator 31 produces a signal 31a which serves to determine the time interval $T_1$ for detecting the analogue quantity and has a waveform shown in FIG. 3(a). The timing generator 32 is destined to produce signals 32a and 32b sequentially as shown in FIG. 3, (b) and (c), when the signal 31a produced by the oscillator 31 is at a low level.

The signal 31a is applied to an input terminal of the AND gate 4 which has the other input connected to the output terminal 234 of the function generator 2. The AND gate 4 serves to gate the signal from the function generator 2 into the counter circuit 5 when the signal 31a is at a high level. The signal from the function generator as well as the output signal from the AND gate 4 are also shown in FIG. 3 by waveforms (d) and (e), respectively.

The signal 32a serves to transfer data from the latching circuit 9 which latches the contents of the counter circuit 5 during the detecting phase, while the signal 32b is utilized to reset the counter circuit 5 after the transfer of data with the aid of the signal 32a. More specifically, the counter circuit 5 counts the signal from the AND gate 4 and produces the counted content thereof at the output terminals (O to $n$), which content is latched by the latch circuit 9 until the appearance of the signal 32a, while the counter 5 is reset by the signal 32b.

The memory circuit 6 stores previously programs or patterns for determining characteristics of the function generator 2 in the analogue-to-digital conversion thereof and produces outputs at the output terminals (O to $n$) in correspondence with the access words to which the access is made.

The comparator circuit 7 is operative to compare the counted content of the counter 5 with the output from the memory circuit 6 and produces signal "O" when they are coincident with each other and signal "1" when they are out of coincidence.

The switching circuit 8 comprises a shift register 80 and switches $SW_1$ to $SW_n$ corresponding to the output taps 1 to $m$ of the shift register 80, which are connected to the access word inputs 1 to $m$ of the memory circuit 6. The output of the shift register 80 is caused to advance incrementally starting from the position "1" by the signal from the comparator 7 and shift register is reset by the signal 32b to the original position "1". The switches $SW_1$ to $SW_m$ are sequentially closed by the incremental output from the shift register 80, as a result of which the resistance value $R_i'$ is changed thereby to vary the time constants of the integrator circuit and the capacitor discharge circuit in the function generator. In other words, the period T and hence the frequency f of the output signal from the function generator 2 is varied in dependence on the states of the switches $SW_1$ to $SW_m$, as is shown in FIG. 2a by a group of curves $R_1$ to $R_m$ which are readily varied by the values of the resistor $R_i$.

It is now assumed that the analogue input quantity is converted into the digital output in accordance with the conversion curves $R_1$, $R_2$, $R_3$, $R_4$ and $R_m$ in the intervals $V_a$ to $V_1$, $V_1$ to $V_2$, $V_2$ to $V_3$, $V_3$ to $V_4$ and $V_{m-1}$ to $V_m$, respectively, of the variation in the analogue input V, as indicated in FIG. 2a by the solid line sections. These intervals can be arbitrarily determined.

In this connection, the relation between the input and the output of the memory circuit 6 is selected in such a manner as indicated in the following table.

TABLE

| Words | 1 | 2 | 3 |
|---|---|---|---|
| Digital Outputs | 0 $n_1$ | $n_1$ $n_1 + (n_3 - n_2)$ | $n_1 + (n_3 - n_2)$ $(n_1 + n_3 + n_5)$ |
| | — | — | $n$ |
| $-(n_2 + n_4)$ | — | — | $(n_1 + n_3 + \ldots + n_{2N-3}) -$ |
| $(n_2 + n_4 + \ldots + n_{2N-4})$ $(n_1 + n_3 + \ldots + n_{2N-1}) - (n_2 + n_4 + \ldots$ | | | |
| $n_{2N-2})$ | | | |

Figure 2B:
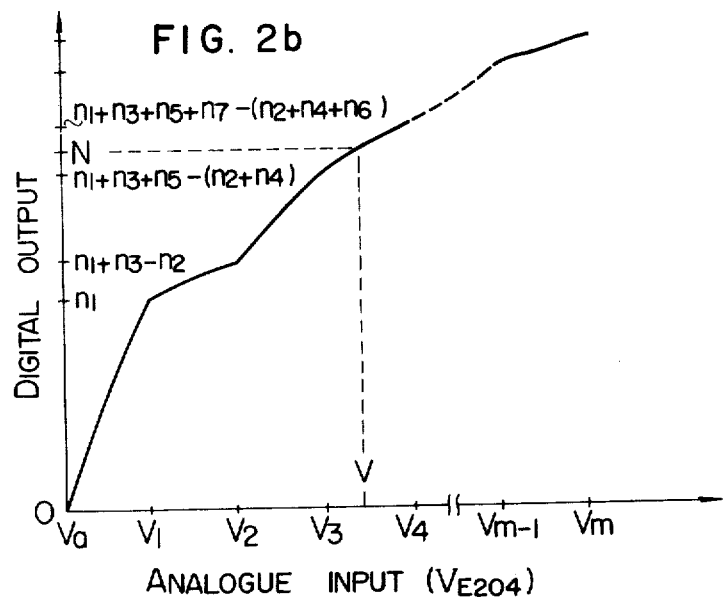
FIG. 2b is a graph illustrating a relation between the analogue input and the digital output of a function generator embodying the principle of the invention.

In operation, the function generator 2 will produce the pulse signal of an oscillation frequency corresponding to the analogue input V at first in accordance with the conversion curve $R_1$. The pulse signal is counted by the counter circuit 5, the content of which is compared with the output from the memory circuit 6 by means of the comparator circuit 7. When the counted content exceeds $n_1$, the comparator circuit 7 produces a corresponding signal thereby to shift the register 80, as a result of which the time constant of the function generator is changed. Now, the analogue-to-digital conversion is performed in accordance with the conversion curve $R_2$ and similar processes are repeated. The result is the conversion characteristic between the analogue input and the digital output such as shown in FIG. 2b. It is apparent that non-linear digital quantity N can be obtained from the analogue input V.

From the foregoing description, it will be appreciated that any desired analogue-to-digital conversion relation can be obtained by varying the resistance value $R_i'$ of the resistor $R_i$ and changing the content stored in the memory circuit 7. Besides, a non-linear analogue-to-digital converter having a good approximation can be accomplished by employing the analogue-to-digital conversion curves in the non-linear form for the function generator 2.

What we claim is:

1. A non-linear analogue-to-digital converter having a variable conversion performance, comprising;
    a control pulse generator circuit for producing gate pulses of a predetermined duration and a reset pulse signal when said gate pulse signal is at logical level "O",
    a function generator having a plurality of analogue-to-digital conversion characteristics each corresponding to associated resistors provided discretely,
    an AND gate applied at input thereof with a signal from said function generator and said gate pulse signal from said control pulse generator circuit,
    a counter circuit for counting signal from said AND gate and adapted to be reset by said reset pulse signal from said control pulse generator,
    a storing means in which patterns for determining said analogue-to-digital conversion performance is previously stored,
    a comparator circuit for comparing the stored content of said storing means with the count value of said counter circuit to produce a shift pulse when said count value exceeds said stored content, and a switching means for sequentially changing-over resistors provided for determining said analogue-to-digital conversion characteristic of said function generator in response to said shift pulse signal from said comparator circuit.

2. A non-linear analogue-to-digital converter as set forth in claim 1, wherein said function generator is of non-linear analogue-to-digital conversion characteristics.

3. A non-linear analogue-to-digital converter as set forth in claim 1, wherein said function generator utilizes a charging and discharging of a capacitor.

4. A non-linear analogue-to-digital converter as set forth in claim 1, wherein said function generator comprises;

an integrator circuit composed of resistors changed-over by a switching circuit and a capacitor, said integrator circuit being adapted to be applied with a voltage proportional to an analogue input voltage, a first comparator having an input to which the output from said integrator circuit is applied, a second comparator having an input to which the output from said integrator circuit is applied, a flip-flop circuit having a set input coupled to the output of said first comparator and a reset input coupled to the output of said second comparator, and means for discharging said capacitor of said integrator circuit by using the integrated voltage thereof.

5. A non-linear analogue-to-digital converter having a variable conversion performance, comprising:

a gate pulse generator circuit for producing gate pulses of a predetermined constant duration;

non-linear function generator means with a plurality of non-linear voltage-to-frequency conversion characteristics said non-linear function generator means including an integrator circuit having a plurality of resistors and a capacitor to which an input voltage is supplied through one of said resistors, first and second comparators each of which has an input terminal supplied with the output of said integrator circuit and another input terminal supplied with a predetermined voltage, a flip-flop circuit for producing pulses in response to the output from said first and second comparators, and means for controlling the charging and discharging of said capacitor in said integrator circuit in response to the output from said flip-flop circuit;

switching means for changing-over the resistors of said integrator circuit of said non-linear function generator means;

counter means for counting the output pulses from said non-linear function generator means during the duration of said gate pulse; and controlling means for controlling said switching means in response to the counted value of said counter means.

6. A non-linear analogue-to-digital converter as set forth in claim 5, wherein said controlling means comprises a comparator and a memory circuit for storing one of programs and patterns for determining the characteristic of said function generator means and controls the operation of said switching means by comparing the counted value of said counter means with a content of said memory circuit.

* * * * *